(12) United States Patent
Yayama

(10) Patent No.: US 12,306,659 B2
(45) Date of Patent: May 20, 2025

(54) SEMICONDUCTOR DEVICE

(71) Applicant: RENESAS ELECTRONICS CORPORATION, Tokyo (JP)

(72) Inventor: Kosuke Yayama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 183 days.

(21) Appl. No.: 18/059,147

(22) Filed: Nov. 28, 2022

(65) Prior Publication Data
US 2023/0195159 A1 Jun. 22, 2023

(30) Foreign Application Priority Data

Dec. 22, 2021 (JP) ................. 2021-208627

(51) Int. Cl.
*G11C 5/14* (2006.01)
*G06F 1/04* (2006.01)
*H03B 5/12* (2006.01)
*H03K 19/0944* (2006.01)

(52) U.S. Cl.
CPC ............... *G06F 1/04* (2013.01); *G11C 5/145* (2013.01); *H03B 5/1284* (2013.01); *H03K 19/0944* (2013.01)

(58) Field of Classification Search
CPC ..... G06F 1/04; G06F 1/06; G06F 1/28; G11C 5/145; H02M 3/07; H02M 3/075; H03B 5/1284; H03K 5/24; H03K 19/0944
USPC ............................................. 365/182, 230.05
See application file for complete search history.

(56) References Cited

U.S. PATENT DOCUMENTS

| 7,215,936 | B2 * | 5/2007 | Sadowski | H04B 1/30 |
| | | | | 455/259 |
| 7,541,848 | B1 * | 6/2009 | Masuda | H03L 7/18 |
| | | | | 327/147 |
| 11,418,205 | B1 * | 8/2022 | Schwarz | H03L 7/0992 |
| 2006/0132417 | A1 * | 6/2006 | Shigenobu | G09G 3/3696 |
| | | | | 345/98 |
| 2007/0133729 | A1 * | 6/2007 | Hsiao | H03L 7/0893 |
| | | | | 375/376 |
| 2008/0101521 | A1 * | 5/2008 | Lee | H03L 7/0995 |
| | | | | 375/371 |
| 2008/0218217 | A1 * | 9/2008 | Masuda | H03L 7/0995 |
| | | | | 327/536 |
| 2018/0005685 | A1 | 1/2018 | Hasegawa | |
| 2018/0239307 | A1 * | 8/2018 | Tsutsumi | H03L 7/087 |
| 2019/0310699 | A1 | 10/2019 | Saby et al. | |
| 2020/0287552 | A1 * | 9/2020 | Sudo | H03L 1/026 |
| 2021/0067310 | A1 * | 3/2021 | Lim | H04L 7/0004 |
| 2021/0119531 | A1 * | 4/2021 | Chou | H02M 3/073 |
| 2021/0119634 | A1 * | 4/2021 | Yang | H03L 7/087 |
| 2021/0263550 | A1 * | 8/2021 | Noh | G06F 3/0632 |
| 2021/0313879 | A1 * | 10/2021 | Hsieh | H02M 3/155 |

(Continued)

*Primary Examiner* — Michael T Tran
(74) *Attorney, Agent, or Firm* — Rimon P.C.

(57) ABSTRACT

A technique capable of detecting a substrate bias voltage at a low power consumption is provided. The technique including: a voltage boost circuit outputting a boost voltage based on a first clock signal having a first frequency; a voltage drop circuit outputting a drop voltage based on a second clock signal having a second frequency; and a logic circuit block comparing the first frequency and the second frequency and outputting a comparison result between the first frequency and the second frequency in accordance with predetermined criteria is provided.

5 Claims, 17 Drawing Sheets

(56) References Cited

U.S. PATENT DOCUMENTS

| | | | |
|---|---|---|---|
| 2021/0376841 A1* | 12/2021 | Okada | H03B 5/02 |
| 2022/0019702 A1* | 1/2022 | Black | G06F 21/71 |
| 2022/0190719 A1* | 6/2022 | Zanchi | H02M 3/158 |

\* cited by examiner

SEMICONDUCTOR DEVICE

CROSS-REFERENCE TO RELATED APPLICATION

The disclosure of Japanese Patent Application No. 2021-208627 filed on Dec. 22, 2021, including the specification, drawings and abstract is incorporated herein by reference in its entirety.

BACKGROUND

The present disclosure relates to a semiconductor device, and relates to a technique effectively applied to a semiconductor device including a MISFET using a SOTB.

There are disclosed techniques listed below.
[Patent Document 1] U.S. Unexamined Patent Application Publication No. 2018/0005685
[Patent Document 2] U.S. Unexamined Patent Application Publication No. 2019/0310699

A semiconductor device made of a MISFET using a SOTB (Silicon ON Thin Buried oxide) includes a substrate bias generating circuit generating a substrate bias voltage (VBP) for a P-channel MISFET and a substrate bias voltage (VBN) for an N-channel MISFET. As a proposal of such a semiconductor device, for example, U.S. Unexamined Patent Application Publication No. 2018/0005685 is exemplified.

It is sometimes necessary to test whether the substrate bias voltages such as the substrate bias voltage (VBP) for the P-channel MISFET and the substrate bias voltage (VBN) for the N-channel MISFET are normal voltages. For example, one voltage can be tested by using two comparators (comparing circuits). As a proposal of such a test, for example, U.S. Unexamined Patent Application Publication No. 2019/0310699 is exemplified.

SUMMARY

In the substrate bias generating circuit generating the substrate bias voltage (VBP) for the P-channel MISFET and the substrate bias voltage (VBN) for the N-channel MISFET, four comparators are necessary for detecting the two substrate bias voltages (VBP, VBN). However, a consumption current of the semiconductor device increases by a consumption current of four comparators.

An object of the present disclosure is to provide a technique capable of detecting a substrate bias voltage at a low power consumption.

Other objects and novel characteristics will be apparent from the description of the present specification and the accompanying drawings.

The summary of the typical aspects of the present disclosure will be briefly described as follows:

An embodiment provides a technique including: a voltage boost circuit (CP1) outputting a boost voltage based on a first clock signal (CLKP) having a first frequency (FCLKP); a voltage drop circuit (CP2) outputting a drop voltage based on a second clock signal (CLKN) having a second frequency (FCLKN); and a logic circuit block (CL) comparing the first frequency and the second frequency and outputting a comparison result (CMPOUT) between the first frequency and the second frequency in accordance with predetermined criteria.

According to the embodiment, the substrate bias voltage can be detected at the low power consumption.

BRIEF DESCRIPTIONS OF THE DRAWINGS

DETAILED DESCRIPTION

Embodiments will be explained below with reference to drawings. Note that the same components are denoted by the same reference signs in the following explanation, and the repetitive description thereof will be omitted.

The drawings may be schematically illustrated in comparison to practical aspects in order to make the explanation clear, but are merely one example, and do not limit the interpretation of the present disclosure.

First Embodiment

Figure 1:
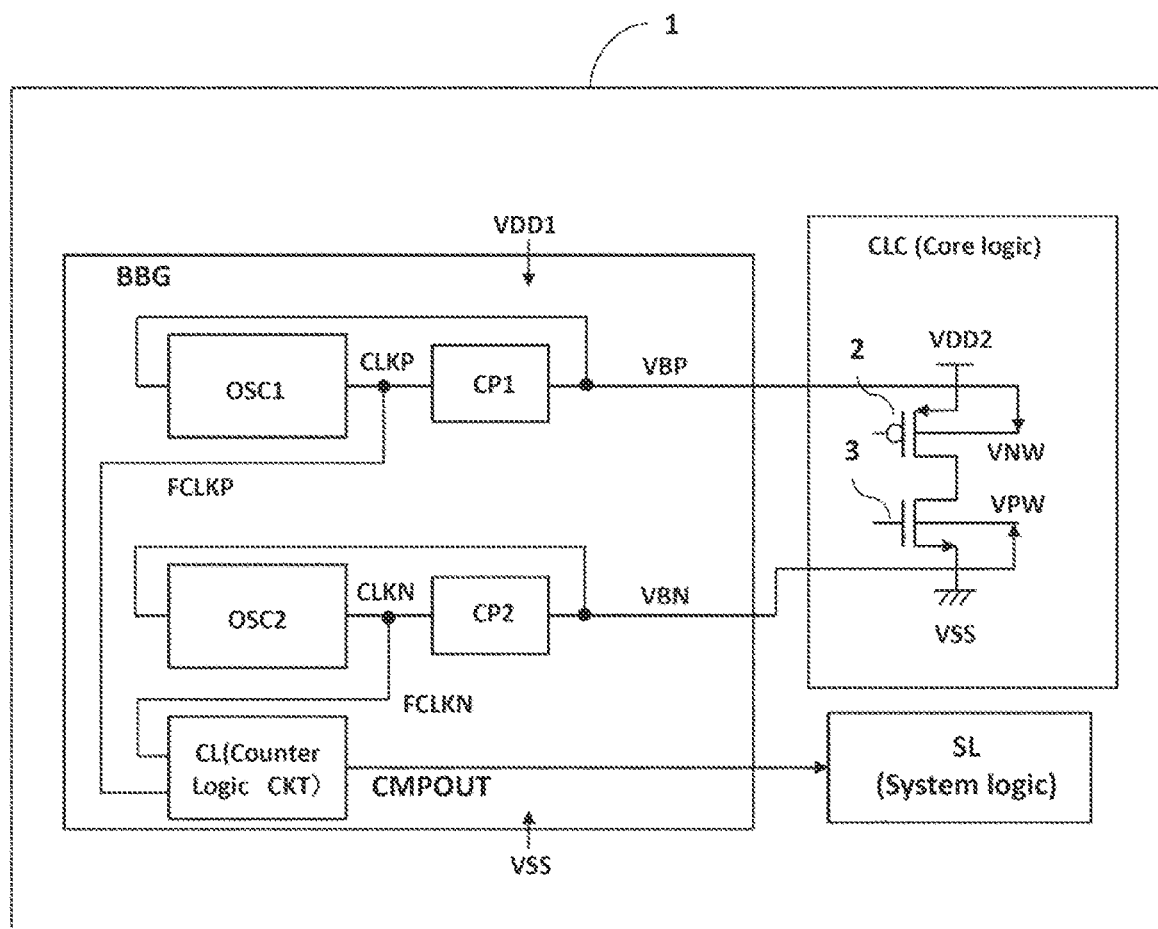
FIG. 1 is a diagram for explaining a substrate bias generating circuit according to a first embodiment.
Figure 2:
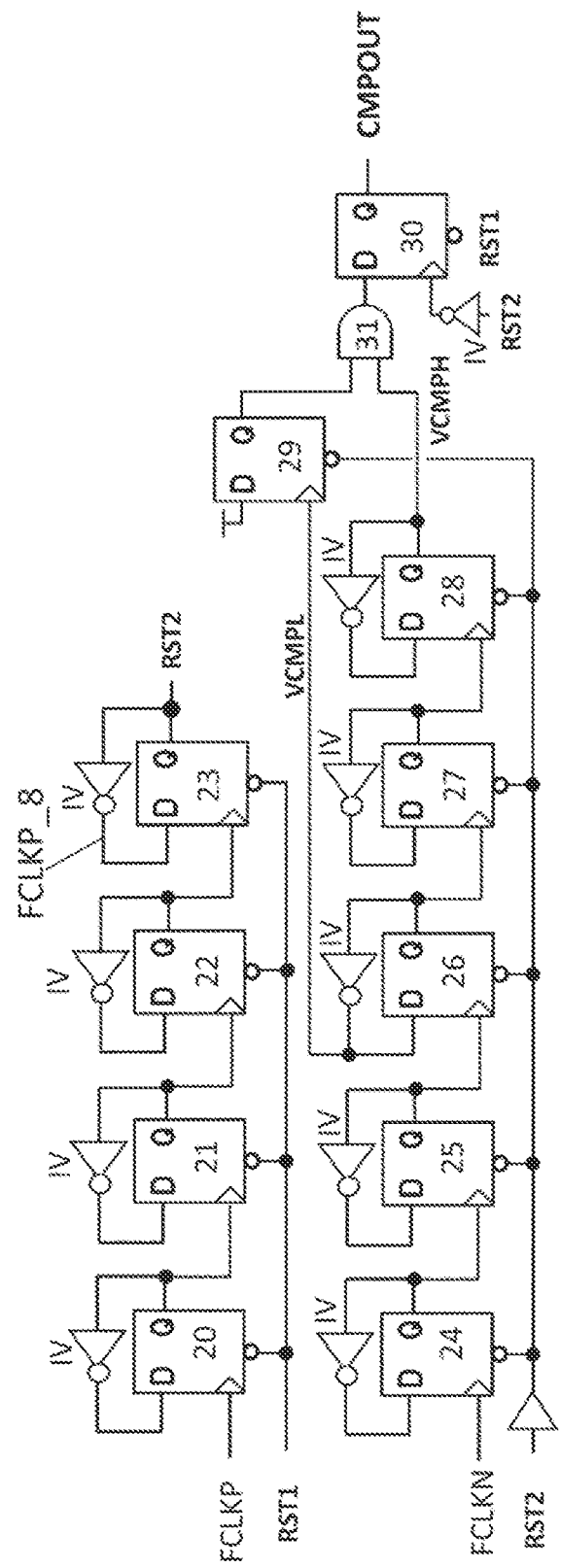
FIG. 2 is a diagram showing a configuration example of a counter logic circuit block CL of FIG. 1.
Figure 3:
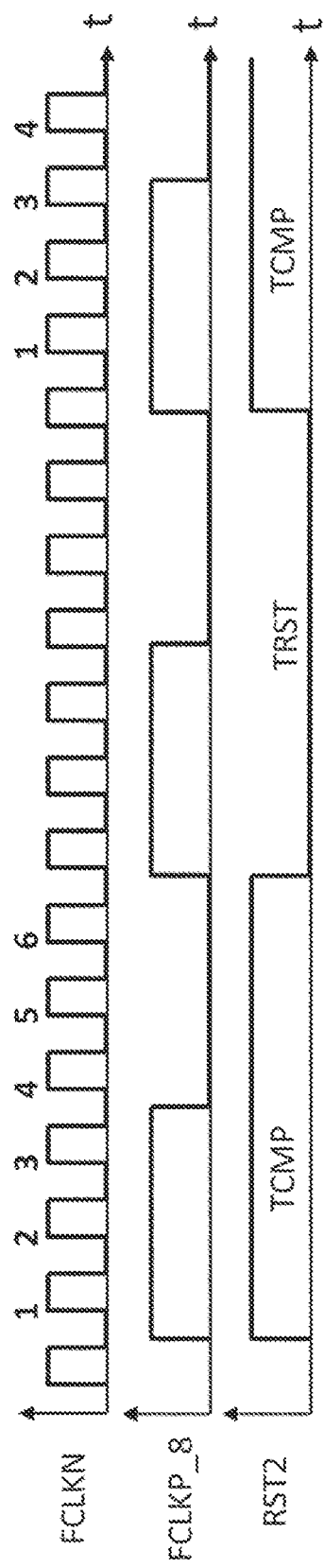
FIG. 3 is a diagram showing an operation of the counter logic circuit block CL of FIG. 2.
Figure 4:
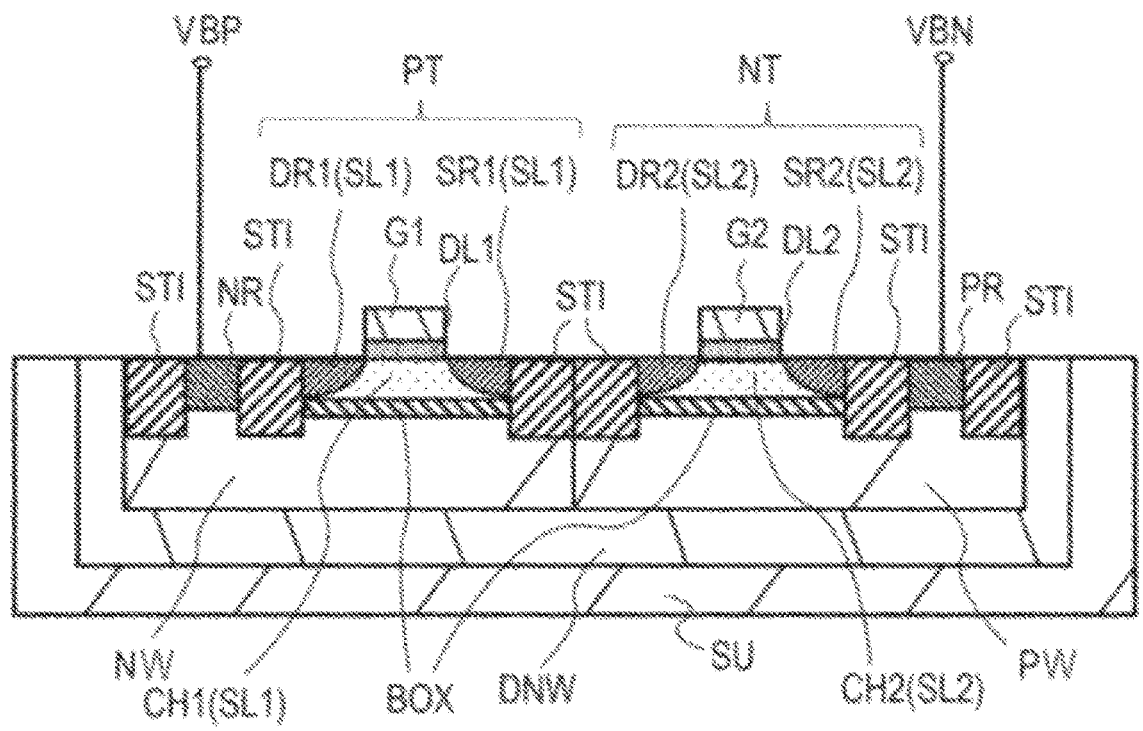
FIG. 4 is a cross-sectional view of a MISFET using an SOTB.
Figure 5:
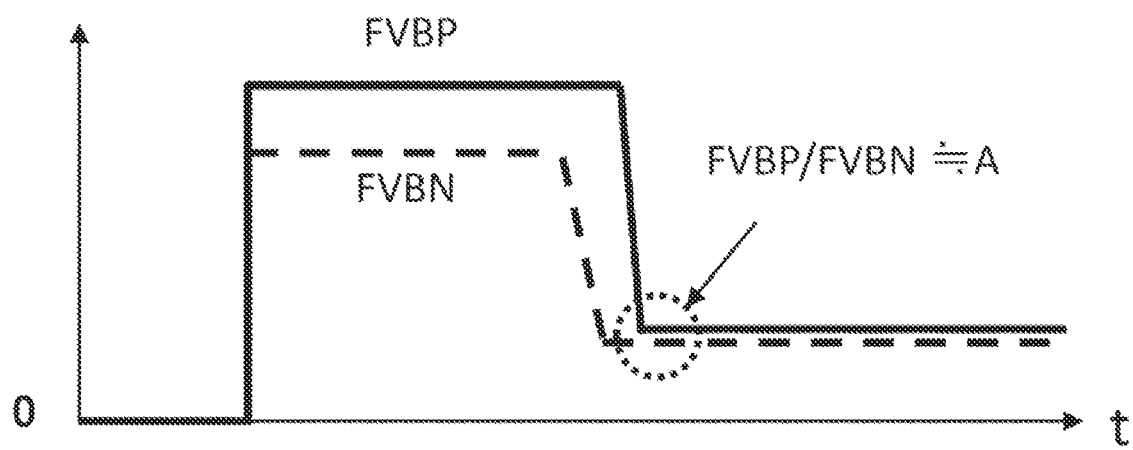
FIG. 5 is a diagram for explaining a consumed power of the counter logic circuit block CL.

FIG. 1 is a diagram for explaining a substrate bias generating circuit according to a first embodiment. FIG. 2 is a diagram showing a configuration example of a counter logic circuit block CL of FIG. 1. FIG. 3 is a diagram showing an operation of the counter logic circuit block CL of FIG. 2. FIG. 4 is a cross-sectional view of a MISFET using an SOTB. FIG. 5 is a diagram for explaining a consumed power of the counter logic circuit block CL.

In FIG. 1, a substrate bias generating circuit BBG includes: a first oscillating circuit OSC1; a second oscillating circuit OSC2; a first charge pump CP1 that is a voltage boost circuit; a second charge pump CP2 that is a voltage drop circuit; and a counter logic circuit block CL that is a logic circuit block.

The first oscillating circuit OSC1 outputs a first clock signal CLKP having a first frequency FCLKP. The second oscillating circuit OSC2 outputs a second clock signal CLKN having a second frequency FCLKN.

The first charge pump CP1 outputs a first substrate bias voltage VBP that is a boost voltage, based on the first clock signal CLKP having the first frequency FCLKP. The second charge pump CP2 outputs a second substrate bias voltage VBN that is a drop voltage, based on the second clock signal CLKN having the second frequency FCLKN. The first substrate bias voltage VBP is, for example, a positive voltage. The second substrate bias voltage VBN is, for example, a negative voltage.

The first substrate bias voltage VBP and the second substrate bias voltage VBN are substrate bias voltages selectively supplied to a substrate gate of a P-channel MISFET 2 and a substrate gate of an N-channel MISFET 3 configuring a large-scale logic circuit (core logic circuit) CLC such as a microcontroller unit MCU, a central processor unit CPU, and a memory circuit arranged in a semiconductor device 1. The substrate bias voltage VBP is set to be a substrate bias voltage of the P-channel MISFET 2, and the substrate bias voltage VBN is set to be a substrate bias voltage of the N-channel MISFET 3. A source-drain path of the P-channel MISFET 2 and a source-drain path of the N-channel MISFET 3 are connected in series between a second power supply potential VDD2 and a ground potential VSS (such as 0 V). Therefore, the large-scale logic circuit CLC can be regarded as a region for supplying the second power supply potential VDD2. Meanwhile, a first power supply potential VDD1 (VDD1>VDD2) and the ground potential VSS are supplied to the substrate bias generating circuit BBG. Therefore, the substrate bias generating circuit BBG can be regarded as a region for supplying the first power supply potential VDD2.

In this case, for example, in a case in which operation modes of the large-scale logic circuit CLC includes a normal operation mode and a standby operation mode, the term "selective" means that the first substrate bias voltage VBP and the second substrate bias voltage VBN are selectively supplied to the substrate gate of the P-channel MISFET 2 and the substrate gate of the N-channel MISFET 3 at the time of shift from the normal operation mode to the standby operation mode. Therefore, a threshold voltage of each of the P-channel MISFET 2 and the N-channel MISFET 3 is larger than a threshold voltage of each of the P-channel MISFET 2 and the N-channel MISFET 3 in the normal operation mode. As a result, a leakage current of the large-scale logic circuit CLC in the standby operation mode can be reduced. When the semiconductor device 1 is driven by a power supply potential output from a battery or others, the leakage current of the semiconductor device 1 can be reduced, and therefore, there is an effect capable of using the power supply potential of the battery or others in a long period of time.

As shown in FIG. 4, each of the P-channel MISFET 2 and the N-channel MISFET 3 can be made of, for example, a MISFET (Metal Insulator Semiconductor Field Effect Transistor) using a SOTB (Silicon ON Thin Buried oxide). FIG. 2 shows each cross-sectional view of the P-channel MISFET 2 and the N-channel MISFET 3. In FIG. 2, the P-channel MISFET 2 and the N-channel MISFET 3 are illustrated as a p-type SOTB transistor PT and an n-type SOTB transistor NT serving as the SOTB transistors. In the SOTB transistor, an n-type well region DNW that is deep is formed on a p-type substrate SU made of a single crystal silicon or others.

In the p-type SOTB transistor PT, an n-type well region NW is formed on the n-type well region DNW. An insulating film BOX is formed on the n-type well region NW. A semiconductor layer SL1 is formed on the n-type well region NW so as to sandwich the insulating film BOX. In the semiconductor layer SL1, a $p^+$-type region SR1 that is a source region of the p-type SOTB transistor PT and a $p^+$-type region DR1 that is a drain region of the same are formed. Between the $p^+$-type region SR1 and the $p^+$-type region DR1 in the semiconductor layer SL1, a channel region CH1 substantially not containing impurities is formed. An impurity concentration of the channel region CH1 is, for example, equal to or lower than $3\times10^{17}$ cm$^{-3}$. A gate electrode G1 of the p-type SOTB transistor PT is formed above the channel region CH1 so as to arrange a gate insulating film DL1 therebetween.

In the n-type SOTB transistor NT, a p-type well region PW is formed on the n-type well region DNW. An insulating film BOX is formed on the p-type well region PW. A semiconductor layer SL2 is formed on the p-type well region PW so as to sandwich the insulating film BOX. In the semiconductor layer SL2, an $n^+$-type region SR2 that is a source region of the n-type SOTB transistor NT and an $n^+$-type region DR2 that is a drain region of the same are formed. Between the $n^+$-type region SR2 and the $n^+$-type region DR2 in the semiconductor layer SL2, a channel region CH2 substantially not containing impurities is formed. An impurity concentration of the channel region CH2 is, for example, equal to or lower than $3\times10^{17}$ cm$^{-3}$. A gate electrode G2 of the n-type SOTB transistor NT is formed above the channel region CH2 so as to arrange a gate insulating film DL2 therebetween.

A thickness of the insulating film BOX is, for example, about 10 nm. On the n-type well region NW in the p-type SOTB transistor PT, an $n^+$-type region NR where the substrate bias generating circuit BBG supplies the first substrate bias voltage (also referred to as back bias voltage) VBP to the n-type well region NW is formed. On the p-type well region PW in the n-type SOTB transistor NT, a $p^+$-type region PR where the substrate bias generating circuit BBG supplies the second substrate bias voltage (also referred to as back bias voltage) VBN to the p-type well region PW is formed. The p-type SOTB transistor PT, the n-type SOTB transistor NT, the $p^+$-type region PR and the $n^+$-type region NR are separated from one another by an element isolating film STI.

In the case of the n-type SOTB transistor NT, when the back bias voltage VBN is a negative voltage, an absolute value of the threshold voltage can be increased, and the leakage current can be decreased. On the other hand, in the case of the p-type SOTB transistor PT, when the back bias voltage VBP is a positive voltage, the absolute value of the threshold voltage can be increased, and the leakage current can be decreased. The leakage current exponentially changes with respect to the change of the back bias voltage.

Therefore, the threshold voltages of the p-type SOTB transistor PT and the n-type SOTB transistor NT are controlled by the back bias voltages VBN and VBP to decrease the leakage current. As a result, the power consumption of the large-scale logic circuit CLC including the p-type SOTB transistor PT and the n-type SOTB transistor NT can be decreased.

In the p-type SOTB transistor PT and the n-type SOTB transistor NT, a short channel effect can be suppressed by reducing the thickness of the channel layer formed on the insulating film BOX. The threshold voltage can be controlled by adjusting the impurity concentrations of the n-type well region NW and the p-type well region PW below the insulating film BOX. Therefore, variation in the threshold voltage can be suppressed by decrease in the impurity concentration of the channel layer. In the SOTB transistor, the threshold voltage of each transistor can be adjusted by application of a voltage from the substrate (that is application of the first substrate bias voltage VBP and the second substrate bias voltage VBN) along with usage of the thin insulating film BOX. In other words, the substrate bias voltage VBP is set to be a well potential VNW of the n-type well region NW below the insulating film BOX, and the substrate bias voltage VBN is set to be a well potential VPW of the p-type well region PW below the insulating film BOX. This case has an advantage that a joint leakage current between the source or the drain and a bulk substrate hardly becomes a problem since the thin insulating film BOX is formed.

The counter logic circuit block CL compares the first frequency FCLKP and the second frequency FCLKN, and outputs a comparison result CMPOUT between the first frequency FCLKP and the second frequency FCLKN in accordance with predetermined criteria.

The first oscillating circuit OSC1 generates the first clock signal CLKP to be supplied to the first charge pump CP1, and the first frequency FCLKP of the first clock signal CLKP changes to bring a voltage value of the first substrate bias voltage VBP to a target voltage.

The second oscillating circuit OSC2 generates the second clock signal CLKN to be supplied to the second charge pump CP2, and the second frequency FCLKN of the second clock signal CLKN changes to bring a voltage value of the second substrate bias voltage VBN to a target voltage.

The two clock signals CLKP and CLKN are counted by a counter in the counter logic circuit block CL. If the counter value is within a defined range, the counter logic circuit block CL sets the comparison result CMPOUT to, for example, a high level H (CMPOUT=H). If the counter value is out of the defined range, the counter logic circuit block CL sets the comparison result CMPOUT to, for example, a low level L (CMPOUT=L). The comparison result CMPOUT can be used as a detection signal for detecting whether each voltage value of the first substrate bias voltage VBP and the second substrate bias voltage VBN is normal or anomal.

The comparison result CMPOUT is supplied to, for example, a system control logic circuit SL. The system control logic circuit SL can generate a control signal based on the value (such as the high level H) of the comparison result CMPOUT in order to apply the first substrate bias voltage VBP to the n-type well region NW and apply the second substrate bias voltage VBN to the p-type well region PW. The system control logic circuit SL can generate a control signal based on the value (such as the low level L) of the comparison result CMPOUT in order to alert that the first substrate bias voltage VBP and the second substrate bias voltage VBN are anomal.

Next, with reference to FIGS. 2 and 3, a configuration example and an operation of the counter logic circuit block CL of FIG. 1 will be explained. In FIG. 3, a term "t" indicates time.

The counter logic circuit block CL includes: D-FF (D-type flip flops) 20 to 30 with a rest terminal; and a counter circuit made of an AND circuit 31 and others. In the D-FF 20 to 23, a Q terminal and a D terminal of each D-FF are connected to each other by an inverter circuit so that an inversion signal of the Q terminal is input to the D terminal. A clock terminal of the D-FF 20 is connected to receive the first clock signal CLKP having the first frequency FCLKP as its input. Each clock terminal of the D-FF 21, 22 and 23 is connected to receive a signal of the Q terminal of each of the D-FF 20, 21 and 22 on respective pre-stages as its input. Each reset terminal of the D-FF 20 to 23 is configured to receive a first reset signal RST1 as its input. A signal of a G terminal of the D-FF 23 is set to a second reset signal RST2. A signal of a D terminal of the D-FF 23 is set to a FCLK_8 signal.

In the D-FF 24 to 28, a Q terminal and a D terminal of each D-FF are connected to each other by an inverter circuit IV so that an inversion signal of the Q terminal is input to the D terminal. A clock terminal of the D-FF 24 is connected to receive the second clock signal CLKN having the second frequency FCLKN as its input. Each clock terminal of the D-FF 25, 26, 27 and 28 is connected to receive a signal of the Q terminal of each of the D-FF 24, 25, 26 and 27 on respective pre-stages as its input. Each reset terminal of the D-FF 20 to 28 is connected to receive a second reset signal RST2 as its input.

The D-FF 29 includes a clock terminal connected to a D terminal of the D-FF 26 and receiving a signal VCMPL as its input and a rest terminal receiving the second reset signal RST2 as its input. A Q terminal of the D-FF 29 is connected to a first input of the AND circuit 31. A Q terminal of the D-FF 28 is connected to a second input of the AND circuit 31 as its signal VCMPH. The Q terminal of the D-FF 29 operates to change from L to H at the fourth count, and the Q terminal of the D-FF 28 operates to change from L to H at the sixteenth count.

An output of the AND circuit 31 is connected to a D terminal of the D-FF 30. A rest terminal of the D-FF 30 receives the first reset signal RST1 as its input. A clock terminal of the D-FF 30 receives an inversion signal of the second reset signal RST2 as its input through the inverter circuit. A Q terminal of the D-FF 30 is set as a signal of the comparison result CMPOUT.

As shown in FIG. 3, the high level H (CMPOUT=H) is output as the value of the comparison result CMPOUT if the second clock signal CLKN having the second frequency FCLKN is 4 to 16 (4 to 16 pulses) in an 8-count period of the first clock signal CLKP having the first frequency FCLKP (that is a period of the high level H of the FCLK_8 signal). In FIG. 3, note that a period of the high level H of the second reset signal RST2 is a comparison period TCMP while a period of the low level H of the second reset signal RST2 is a reset period TRST.

With reference to FIG. 5, a consumed current of the counter logic circuit block CL will be explained. In FIG. 5, a vertical axis indicates the frequency (Freq), and a horizontal axis indicates the time (t). A frequency FVBP illustrated with a solid line indicates change of an oscillation frequency of the first oscillating circuit OSC1, and a frequency FVBN illustrated with a broken line indicates change of an oscillation frequency of the second oscillating circuit OSC2. The frequencies FVBP and FVBN are counted by the counter logic circuit block CL. As shown in FIG. 5, the counter logic circuit block CL operates at a high speed (several MHz) during a charge period of the first charge pump CP1 and the second charge pump CP2. When the voltages (VBP, VBN) generated on the first charge pump CP1 and the second charge pump CP2 are stabled after the charge completion, the counter logic circuit block CL operates at several tens kHz. Therefore, it can be said that the consumed current of the counter logic circuit block CL is at an ignorable level. This would be also understood from the fact that the consumed current of the counter circuit counting the clock of 32 kHz is about 3 nA. A relation between the frequencies FVBP and FVBN at the time of the charge completion is expressed as a constant relation such as "FVBP/FVBN A (here, the term "A" is a predetermined constant)".

According to the first embodiment, when the two substrate bias voltages (VBP, VBN) are detected in the substrate bias generating circuit BBG generating the substrate bias voltage (VBP) for the P-channel MISFET and the substrate bias voltage (VBN) for the N-channel MISFET, it can be detected whether each voltage value of the first substrate bias voltage VBP and the second substrate bias voltage VBN is anormal or not, by the counter logic circuit block CL without the usage of four comparators. In other words, the substrate bias voltages (VBN, VBP) can be detected at the low power consumption without the increase of the consumed current of the semiconductor device 1.

First Modification Example of First Embodiment

Figure 6:
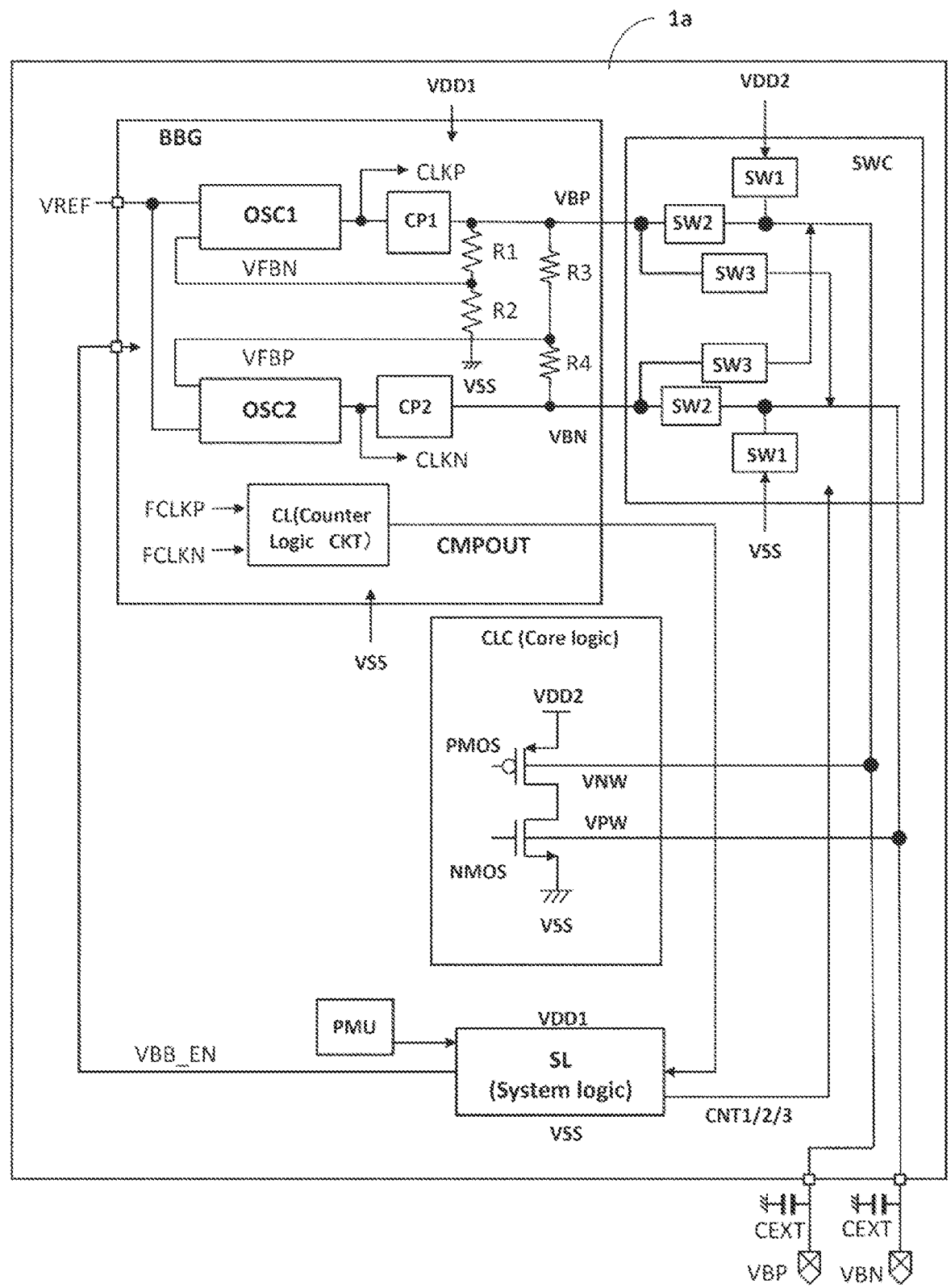
FIG. 6 is a block diagram showing a configuration example of a semiconductor device according to a first modification example of the first embodiment.
Figure 7:
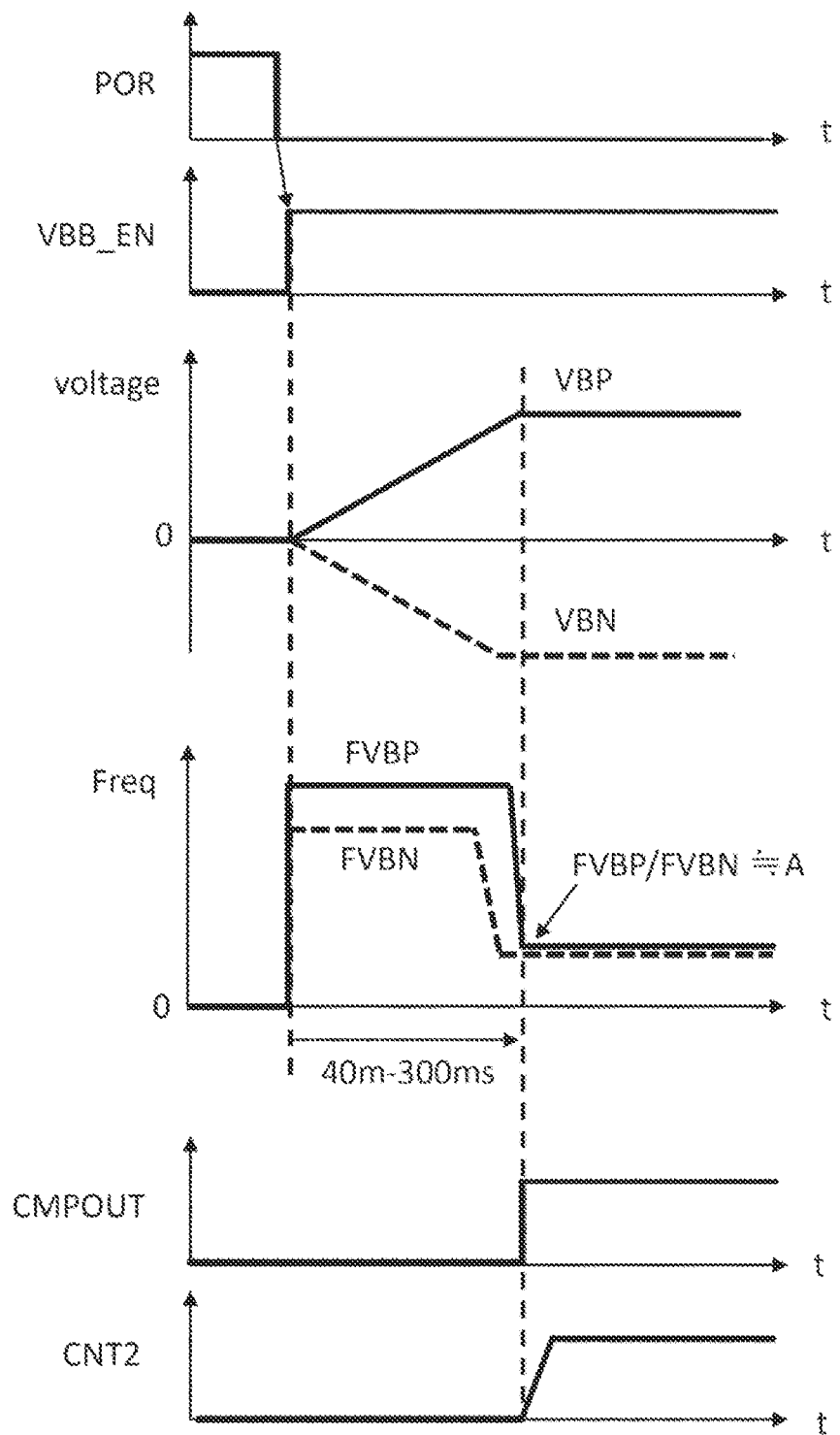
FIG. 7 is a diagram for explaining an operation example of the semiconductor device of FIG. 6.

FIG. 6 is a block diagram showing a configuration example of a semiconductor device 1a according to a first modification example of the first embodiment. FIG. 7 is a diagram for explaining an operation example of the semiconductor device 1a of FIG. 6.

A difference of the semiconductor device 1a of FIG. 6 from the semiconductor device 1 of FIG. 1 will be mainly explained.

1) In the substrate bias generating circuit BBG, a first resistive element R1 and a second resistive element R2 are connected in series between the output of the first charge pump CP1 and the ground potential VSS. A potential VFBN at a connection point (midpoint) between the first resistive element R1 and the second resistive element R2 is configured to be supplied to the first oscillating circuit OSC1. The oscillation frequency (first frequency FCLKP) of the first oscillating circuit OSC1 is determined based on a differential voltage between the reference voltage VFER and the potential VFBN. The potential VFBN is a potential provided by dividing the output voltage of the first charge pump CP1 by the first resistive element R1 and the second resistive element R2.

2) In the substrate bias generating circuit BBG, a third resistive element R3 and a fourth resistive element R4 are connected in series between the output of the first charge pump CP1 and the output of the second charge pump CP2. A potential VFBP at a connection point (midpoint) between the third resistive element R3 and the fourth resistive element R4 is configured to be supplied to the second oscillating circuit OSC2. The oscillation frequency (second frequency FCLKN) of the second oscillating circuit OSC2 is determined based on a differential voltage between the reference voltage VFER and the potential VFBP. The potential VFBP is a potential provided by dividing the output voltage of the first charge pump CP1 and the output voltage of the second charge pump CP2 by the third resistive element R3 and the fourth resistive element R4.

3) In the semiconductor device 1a, a switch circuit SWC is arranged between the substrate bias generating circuit BBG and the substrate gate of the P-channel MISFET 2 and the substrate gate of the N-channel MISFET 3 configuring the large-scale logic circuit (also referred to as core logic circuit) CLC. The switch circuit SWC is configured to select the substrate bias voltage to be supplied to the substrate gate of the P-channel MISFET 2 and the substrate gate of the N-channel MISFET 3. The semiconductor device 1a (or the large-scale logic circuit CLC) is configured to include, for example, three operation modes (that are a normal operation mode, a standby operation mode and a boost operation mode). Note that the boost operation mode may be not included.

In the standby operation mode, a second switch element SW2 of the switch circuit SWC is turned ON by, for example, the high level (selection level) of the control signal CNT2. In this case, note that a first switch element SW1 of the switch circuit SWC is turned OFF by, for example, the low level (non-selection level) of the control signal CNT1, and a third switch element SW3 of the switch circuit SWC is turned OFF by, for example, the low level (non-selection level) of the control signal CNT3. In this manner, the first substrate bias voltage VBP and the second substrate bias voltage VBN are selectively supplied to the substrate gate of the P-channel MISFET 2 and the substrate gate of the N-channel MISFET 3, respectively.

In the normal operation mode, the first switch element SW1 is turned ON by, for example, the high level (selection level) of the control signal CNT1. In this case, note that the second switch element SW2 is turned OFF by, for example, the low level (non-selection level) of the control signal CNT2, and the third switch element SW3 is turned OFF by, for example, the low level (non-selection level) of the control signal CNT3. In this manner, the power supply potential VDD2 and the ground potential VSS are selectively supplied to the substrate gate of the P-channel MISFET 2 and the substrate gate of the N-channel MISFET 3, respectively. The threshold voltage of the P-channel MISFET 2 and the threshold voltage of the N-channel MISFET 3 in the normal operation mode are set to be smaller than the threshold voltage of the P-channel MISFET 2 and the threshold voltage of the N-channel MISFET 3 in the standby operation mode.

In the boost operation mode, the third switch element SW3 is turned ON by, for example, the high level (selection level) of the control signal CNT3. In this case, note that the first switch element SW1 is turned OFF by, for example, the low level (non-selection level) of the control signal CNT1, and the second switch element SW2 is turned OFF by, for example, the low level (non-selection level) of the control signal CNT2. In this manner, the second substrate bias voltage VBN and the first substrate bias voltage VBP are selectively supplied to the substrate gate of the P-channel MISFET 2 and the substrate gate of the N-channel MISFET 3, respectively. In other words, in the boost operation mode, the substrate gate of the P-channel MISFET 2 and the substrate gate of the N-channel MISFET 3 are set to form a forward bias, and the threshold voltage of the P-channel MISFET 2 and the threshold voltage of the N-channel MISFET 3 in this mode are set to be smaller than the threshold voltage of the P-channel MISFET 2 and the threshold voltage of the N-channel MISFET 3 in the normal operation mode. The boost operation mode is an operation mode focusing on an operation speed.

4) The semiconductor device 1a is provided with a power management circuit (also referred to as power management unit) PMU. The system logic circuit SL can control the signal levels (the high level and the lower level) of the control signals CNT1, CNT2 and CNT3, based on the signal from the power management circuit (also referred to as power management unit) PMU. The power management circuit PMU can select the operation mode of the large-scale logic circuit CLC from the normal operation mode, the standby operation mode and the boost operation mode.

5) The system logic circuit SL generates an activation signal VBB_EN for the substrate bias generating circuit BBG, based on a power ON reset signal POR supplied from the power management circuit PMU, and supplies the generated activation signal VBB_EN to the substrate bias generating circuit BBG. The substrate bias generating circuit BBG is configured to start the generation of the first substrate bias voltage VBP and the second substrate bias voltage VBN, based on the activation signal VBB_EN.

6) The system logic circuit SL generates the control signals CNT1, CNT2 and CNT3 and controls the switch circuit SWC, based on the comparison result CMPOUT of the high level H output from the substrate bias generating circuit BBG. The comparison result CMPOUT of the high level H can be also regarded as a set-up completion signal of the substrate bias generating circuit BBG.

Next, an operation example of the semiconductor device 1a will be explained with reference to FIG. 7.

When the power ON reset signal POR supplied from the power management circuit PMU changes from the high level to the low level, the system logic circuit SL changes the activation signal VBB_EN of the substrate bias generating circuit BBG from the low level to the high level.

The substrate bias generating circuit BBG starts the generation of the second substrate bias voltage VBN and the first substrate bias voltage VBP, based on the activation signal VBB_EN of the high level.

The frequency FVBP indicates change of the oscillation frequency FCLKP of the first oscillating circuit PSC1, and the frequency FVBN indicates change of the oscillation frequency FCLKN of the second oscillating circuit PSC2. The frequencies FVBP and FVBN are counted by the counter logic circuit block CL. The counter logic circuit block CL operates at a high speed (several MHz) during a charge period of the first charge pump CP1 and the second charge pump CP2. When the voltages (VBP, VBN) generated on the first charge pump CP1 and the second charge pump CP2 are stabled after the charge completion, the counter logic circuit block CL operates at several tens kHz.

The value of the comparison result CMPOUT changes from the low level L to the high level H (CMPOUT=H) if the second clock signal CLKN having the second frequency FCLKN is 4 to 16 (4 to 16 pulses) (in other words, if each voltage value of the first substrate bias voltage VBP and the second substrate bias voltage VBN is normal) in the 8-count period of the first clock signal CLKP having the first frequency FCLKP (that is a period of the high level H of the FCLK_8 signal).

In this example, the time taken from the change to the high level of the activation signal VBB_EN to the change to the high level H of the comparison result CMPOUT (that is the time from the activation of the substrate bias generating circuit BBG to the charge completion or the time taken until the voltage (VBP, VBN) is stabled) is 40 ms to 300 ms depending on a value of a parasitic capacitance CEXT.

The control signal CNT2 changes from the low level to the high level in response to the change (CMPOUT=H) of the comparison result CMPOUT from the low level L to the high level H. In this manner, the voltage (VBP, VBN) is supplied to each of the substrate gate of the P-channel MISFET 2 and the substrate gate of the N-channel MISFET 3 configuring the large-scale logic circuit CLC.

Second Modification Example of First Embodiment

Figure 8:
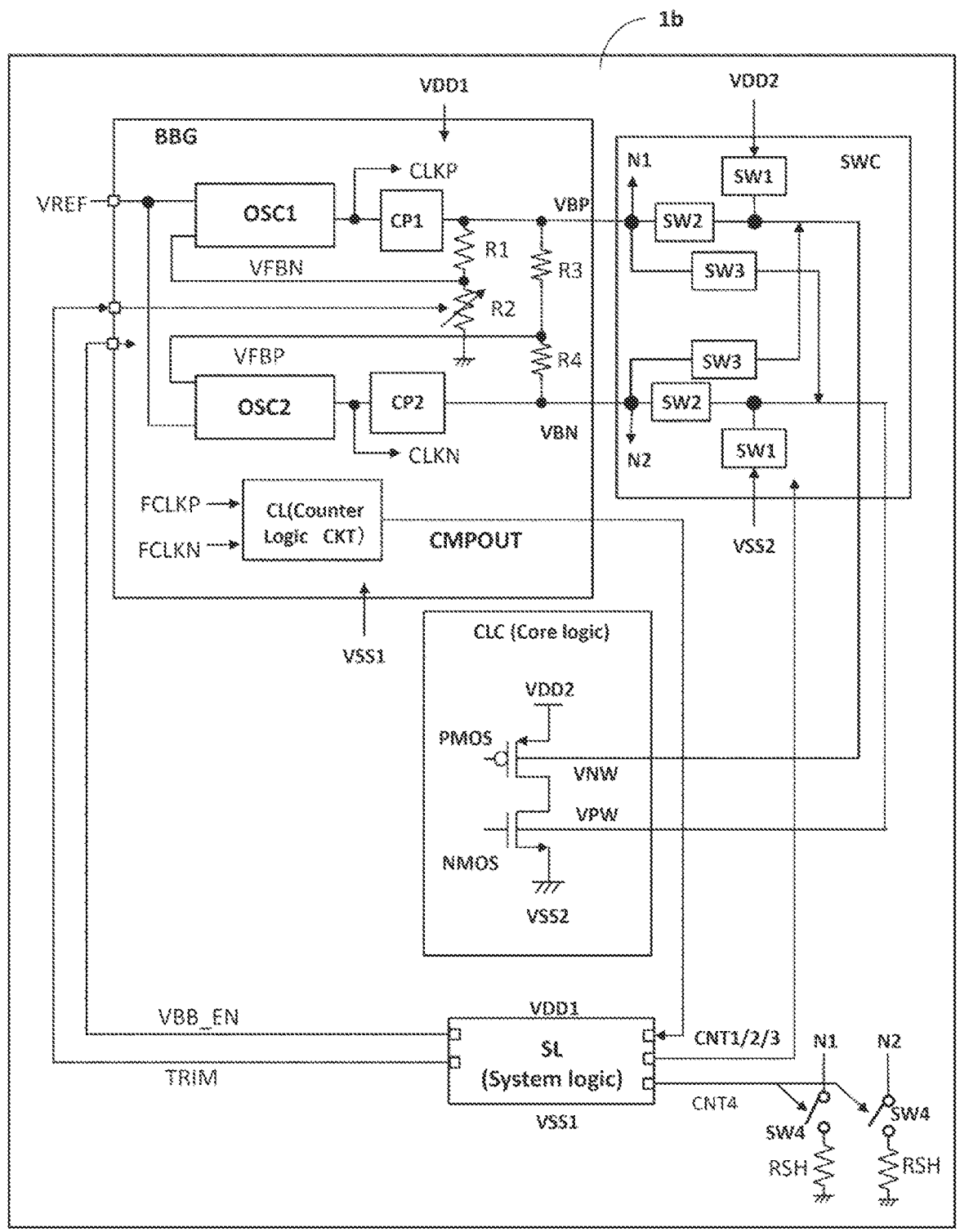
FIG. 8 is a block diagram showing a configuration example of a semiconductor device according to a second modification example of the first embodiment.
Figure 9:
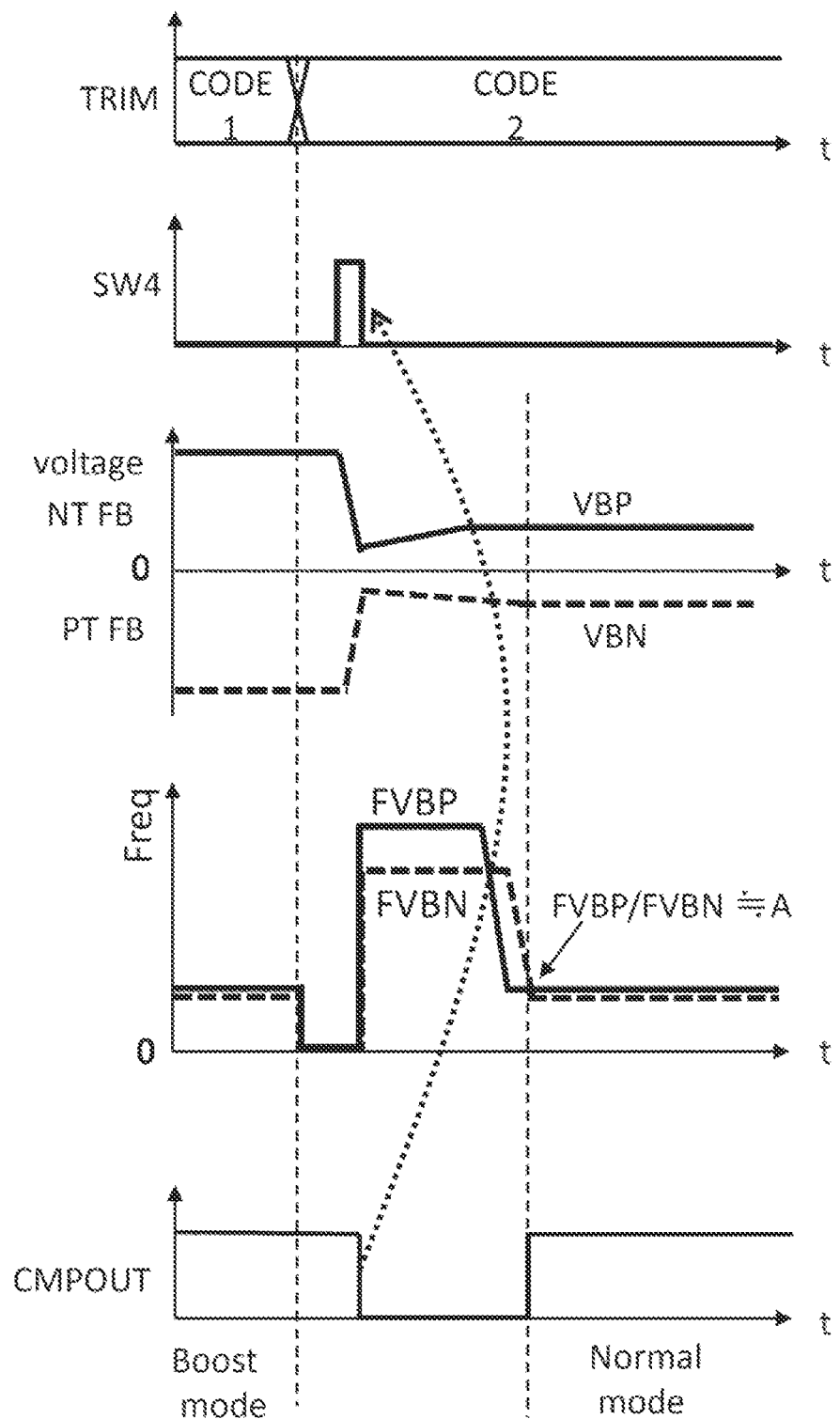
FIG. 9 is a diagram for explaining an operation example of the semiconductor device of FIG. 8.

FIG. 8 is a block diagram showing a configuration example of a semiconductor device 1b according to a second modification example of the first embodiment. FIG. 9 is a diagram for explaining an operation example of the semiconductor device 1b of FIG. 8.

A difference of the semiconductor device 1b of FIG. 8 from the semiconductor device 1a of FIG. 6 will be mainly explained.

1) The second resistive element R2 is made of a variable resistive element, and a value of the second resistive element R2 is configured to be detected, based on a code value of a trim signal (also referred to as trimming signal) TRIM output from the system logic circuit SL.

2) Each of an output node N1 of the first charge pump CP1 and an output node N2 of the second charge pump CP2 is provided with a resistive element (shunt resistive element) RSH so as to arrange a switch element SW4 therebetween. The switch element SW4 is controlled by a control signal CNT4 output from the system logic circuit SL. An operation of the switch element SW4 is controlled so as to be temporarily turned ON at the time of, for example, shift from the boost operation mode (that is the operation mode focusing on the operation speed) to the normal operation mode (that is the operation mode capable of suppressing the leakage current at the middle speed).

Next, an operation example of the semiconductor device 1b will be explained with reference to FIG. 9. Here, a shift case of the operation mode of the semiconductor device 1b from the boost operation mode to the normal operation mode will be explained as the operation example.

In the boost operation mode, the second resistive element R2 is set to have a resistive value based on a code value (code 1) of the trim signal TRIM output from the system logic circuit SL.

For the shift from the boost operation mode to the normal operation mode, the system logic circuit SL changes the code value of the trim signal TRIM from the code 1 to a code 2. In this manner, the operations of the first oscillating circuit OSC1 and the second oscillating circuit OSC2 are stopped, and the frequency FVBP of the first oscillating circuit OSC1 and the frequency FVBN of the second oscillating circuit OSC2 are temporarily set at 0 V.

The system logic circuit SL brings the control signal CNT4 to the high level, and turns ON the switch element SW4. In this manner, the output potentials VBP and VBN of the first charge pump CP1 and the second charge pump CP2 change toward 0 V. In this case, regarding the comparison result CMPOUT of the high level H, even if the frequency FVBP of the first oscillating circuit OSC1 and the frequency FVBN of the second oscillating circuit OSC2 are at 0 V, the level of the comparison result CMPOUT is not updated until the oscillating operation of the first oscillating circuit OSC1 and the second oscillating circuit OSC2 starts again.

The oscillating operation of the first oscillating circuit OSC1 and the second oscillating circuit OSC2 starts again when the first oscillating circuit OSC1 and the second oscillating circuit OSC2 are at a voltage that is equal to or lower than a voltage detected by the resistive value of the second resistive element R2 specified by the code value (code 2) of the trim signal TRIM. After the oscillating operation of the first oscillating circuit OSC1 and the second oscillating circuit OSC2 starts again, the level of the comparison result CMPOUT changes from the high level H to the low level L. Along with this, the system logic circuit SL brings the control signal CNT4 to the low level, and the switch element SW4 is turned OFF.

The frequencies FVBP and FVBN are counted by the counter logic circuit block CL. The counter logic circuit block CL operates at a high speed (several MHz) during a charge period of the first charge pump CP1 and the second charge pump CP2. When the voltages (VBP, VBN) generated on the first charge pump CP1 and the second charge pump CP2 are stabled after the charge completion, the counter logic circuit block CL operates at several tens kHz.

The value of the comparison result CMPOUT changes from the low level L to the high level H (CMPOUT=H) if the second clock signal CLKN having the second frequency FCLKN is 4 to 16 (4 to 16 pulses) (in other words, if each voltage value of the first substrate bias voltage VBP and the second substrate bias voltage VBN is normal) in the 8-count period of the first clock signal CLKP having the first frequency FCLKP (that is a period of the high level H of the FCLK_8 signal). In this manner, the operation mode of the semiconductor device 1b shifts from the boost operation mode to the normal operation mode.

As described above, the boost operation mode sets a Foard bias (FB) that is high in order to increase the speed by decreasing the threshold voltage of the P-channel MISFET 2 and the threshold voltage of the N-channel MISFET 3 configuring the large-scale logic circuit CLC to be small. In this case, in a state without the requirement of the high speed operation (that is the normal operation mode or the standby operation mode other than the boost operation mode), it is necessary to decrease the voltage of the Foard bias (FB) in order to suppress the leakage current, and a control timing of the shunt switch (SW4) and others can be determined. Therefore, the present embodiment is effective for the quick shift of the operation mode.

In the first embodiment, both the anormal voltage and the anormal current of the substrate bias voltages (VBP, VBN) can be detected, and the alert can be issued before functional failure. Examples of the anormal current include, for example, a case of lowering a guaranteed battery-driving period because of breakage of the insulating film BOX, resulted in adhesion of foreign substances on a wiring (such as a terminal in a case of external output) for either the substrate bias voltage (VBP or VBN) to cause excess of a specification of the consumed current of the microcontroller unit MCU and others. When the leakage is caused on both the substrate bias voltage (VBP and VBN), the detection is achieved if the leakage amounts are different.

It can be detected whether the operation failure of the P-channel MISFET 2 and the N-channel MISFET 3 due to the breakage of the insulating film BOX exists. And, the alert can be issued before the function failure occurs. Accordingly, the alert can be transmitted to a host through an edge terminal of an IoT (Internet of Things) field.

It is necessary to secure an offset voltage due to mismatch of the comparator, and a dead band of the voltage to be detected is large (such as difference of ±30 mV). The dead band needs to be larger as the power supply voltage is lower, and therefore, the necessary voltage accuracy may be not satisfied in some cases. On the other hand, in the present embodiment, the circuit (that is the first oscillating circuit OSC1, the second oscillating circuit OSC2) for converting the voltage to be used for the feedback into the frequency is common, and therefore, the mismatch is ignorable.

Figure 10:
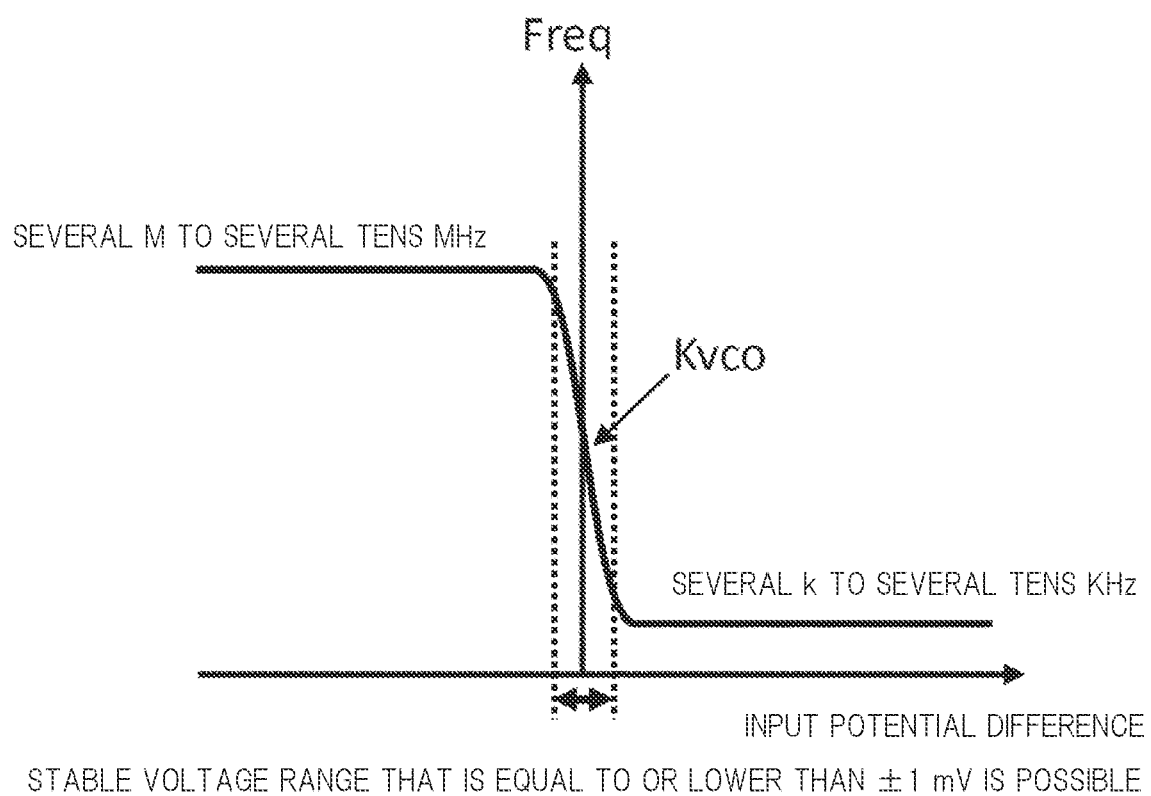
FIG. 10 is a diagram for explaining an operation of an oscillating circuit.

FIG. 10 is a diagram for explaining the operations of the oscillating circuits (OSC1 and OSC2). In FIG. 10, a vertical axis indicates the frequency (Freq), and a horizontal axis indicates an input potential difference. As shown in FIG. 10, a tilt Kvco achieves a high gain, and the dead band of the detection level can be equal to or smaller than ±1 mV.

The frequency is detected by the input difference of the oscillating circuits (OSC1 and OSC2), and therefore, and is not affected regardless of whether the set voltage of the first substrate bias voltage VBP and the second substrate bias voltage VBN is high or low. The present embodiment has the following advantages, and the counter logic circuit block CL can be used as the detection circuit regardless of whether the set voltage of the first substrate bias voltage VBP and the second substrate bias voltage VBN is high or low.

1) The feeding-back oscillating circuit (OSC1, OSC2) converts the potential difference into the frequency, and the converted frequency is used in the detection circuit (the counter logic circuit block CL), and therefore, the mismatch as seen in the comparator or others does not occur.
2) The input potential difference of the oscillating circuit (OSC1, OSC2) is 1/Kvco times, and therefore, the dead band is small. The dead band can be equal to or smaller than ±1 mV.
3) The frequency of the oscillating circuit (OSC1, OSC2) is determined as "I=C×V×Freq". Since variation of a capacitance C and a voltage V is generally about ±20%, variation of the frequency is small.
4) The charge completion of the first substrate bias voltage VBP and the second substrate bias voltage VBN can be detected in several μs.

Second Embodiment

Figure 11:
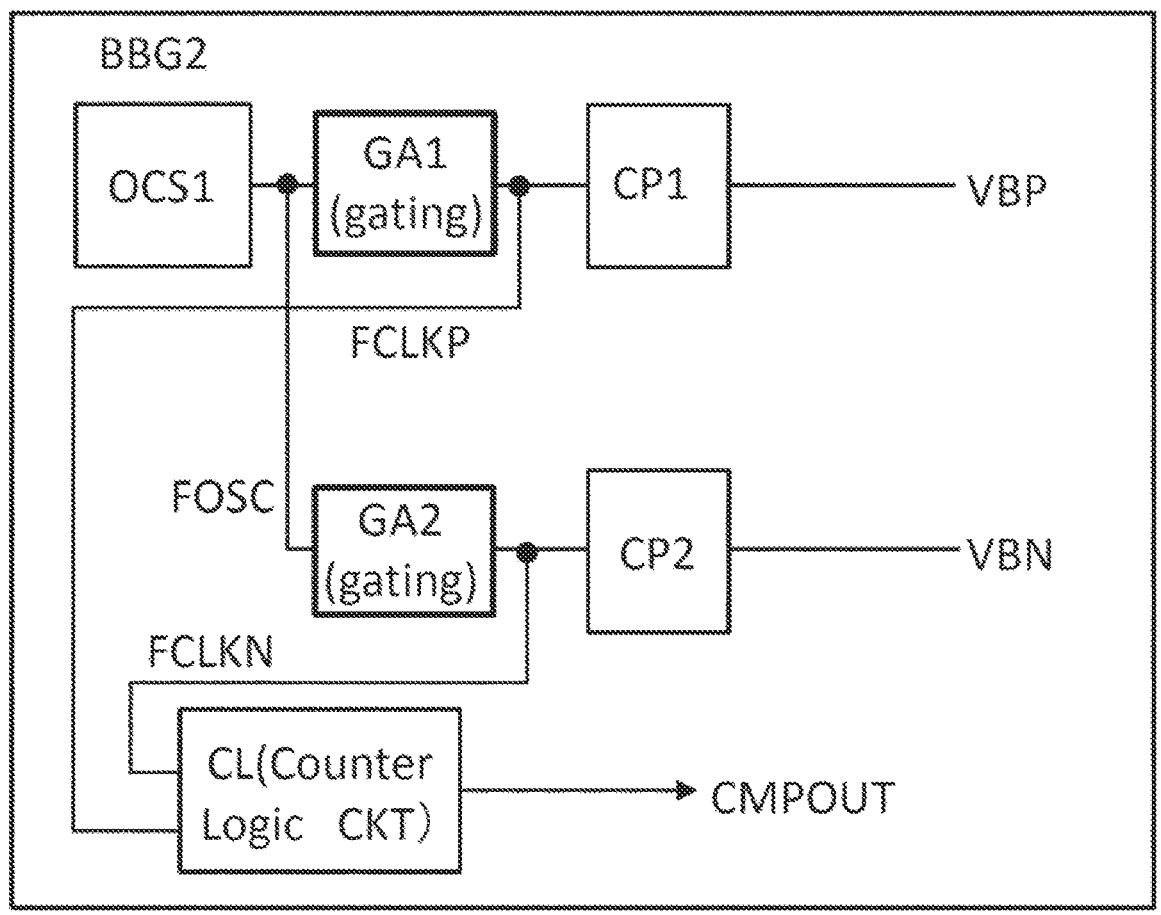
FIG. 11 is a diagram showing a configuration example of a substrate bias generating circuit according to a second embodiment.
Figure 12:
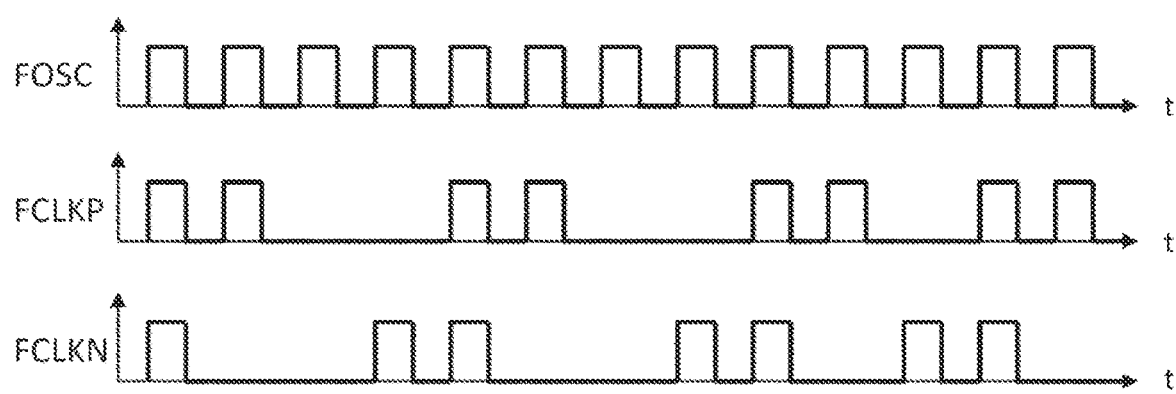
FIG. 12 is a diagram showing a relation among a frequency FOSC, a first frequency FCLKP and a second frequency FCLKN.

FIG. 11 is a diagram showing a configuration example of a substrate bias generating circuit BBG2 according to a second embodiment. FIG. 12 is a diagram showing a relation among a frequency FOSC, the first frequency FCLKP and the second frequency FCLKN.

The first embodiment shown in FIG. 1 is configured to use the two oscillating circuits (OSC1, OSC2). On the other hand, as shown in FIG. 11, the substrate bias generating circuit BBG2 according to the second embodiment takes a configuration example using one oscillating circuit OSC1. Therefore, a first gating circuit (first gate circuit) GT1 and a second gating circuit (second gate circuit) GT2 each having a function of gating and stopping a clock signal CLK having a frequency FOSC oscillated from the oscillating circuit OSC1 are arranged on a previous stage of the first charge pump CP1 that is the voltage boost circuit and a previous stage of the second charge pump CP2 that is the voltage drop circuit, respectively. The first gating circuit GT1 outputs the first clock signal CLKP having the first frequency FCLKP. The second gating circuit GT2 outputs the second clock signal CLKN having the second frequency FCLKN.

FIG. 12 shows a relation among the frequency FOSC of the clock signal CLK oscillated from the oscillating circuit OSC1, the first frequency FCLKP of the first clock signal CLKP output from the first gating circuit GT1 and the second frequency FCLKN of the second clock signal CLKN output from the second gating circuit GT2. In this example, the first gating circuit GT1 generates the first frequency FCLKP by gating four successive clocks having the frequency FOSC so as to pass former two (first and second) clocks of them and not pass the latter two (third and fourth) clocks of them. In this example, the second gating circuit GT2 generates the second frequency FCLKN by gating four successive clocks having the frequency FOSC so as to pass first one (first) and last one (fourth) clocks of them and not pass two (second and third) clocks of them between the first one (first) clock and the last one (fourth) clock.

The second embodiment provides an effect capable of providing the number of the oscillating circuits arranged in the substrate bias generating circuit BBG2 to be one.

Third Embodiment

Figure 13:
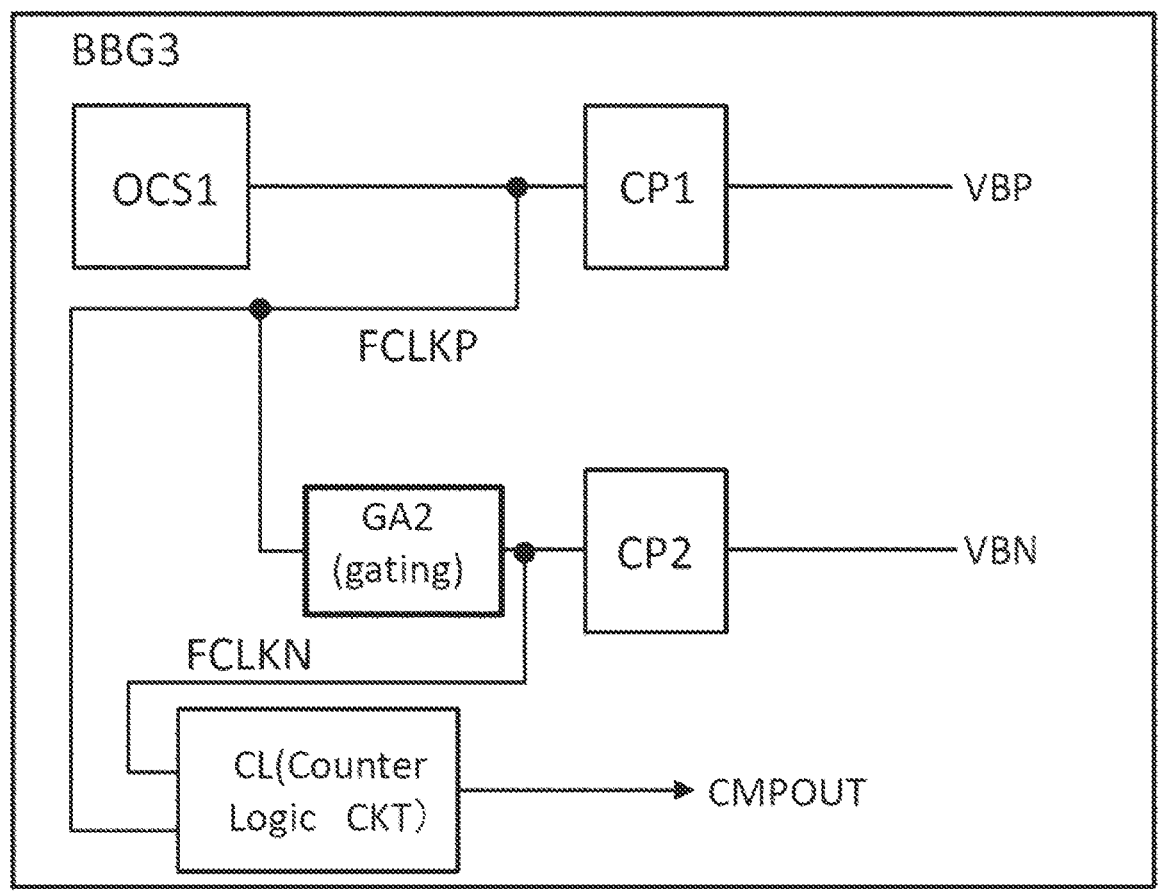
FIG. 13 is a diagram showing a configuration example of a substrate bias generating circuit according to a third embodiment.
Figure 14:
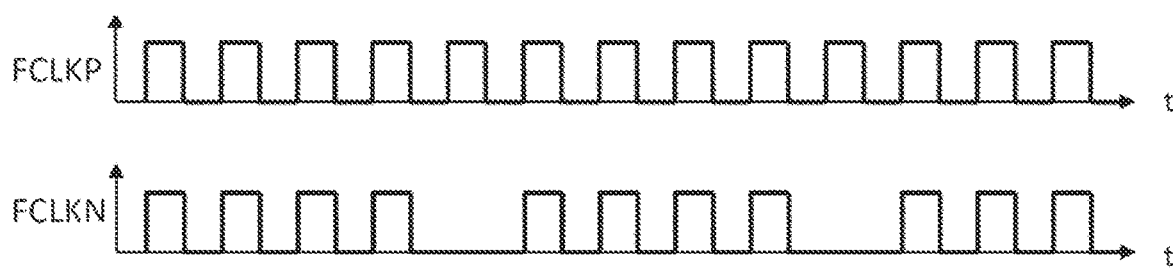
FIG. 14 is a diagram showing a relation between the first frequency FCLKP and the second frequency FCLKN.

FIG. 13 is a diagram showing a configuration example of a substrate bias generating circuit BBG3 according to a third embodiment. FIG. 14 is a diagram showing a relation between the first frequency FCLKP and the second frequency FCLKN.

In the third embodiment, a configuration example of the substrate bias generating circuit BBG3 is configured to remove one gating circuit from the configuration of the substrate bias generating circuit BBG2 of the second embodiment. The number of oscillating circuits can be made to be one by the arrangement of the second gating circuit (second gate circuit) GT2 functioning as gating and stopping the first clock signal CLKP having the first frequency FCLKP while using the fact that a clock necessary for the second frequency FCLKN is lower than the first frequency FCLKP.

The first oscillating circuit OSC1 generates the first clock signal CLKP having the first frequency FCLKP. The second gating circuit GT2 gates the first clock signal CLKP having the first frequency FCLKP, and outputs the second clock signal CLKN having the second frequency FCLKN.

FIG. 14 shows a relation between the first frequency FCLKP of the first clock signal CLKP oscillated from the first oscillating circuit OSC1 and the second frequency FCLKN of the second clock signal CLKN output from the second gating circuit GT2. In this example, the second gating circuit GT2 generates the second frequency FCLKN by gating five successive clocks having the first frequency FCLKP so as to pass former four (first, second, third and fourth) clocks of them and not pass the last one (fifth) clock of them.

The third embodiment provides an effect capable of providing the number of the oscillating circuits arranged in the substrate bias generating circuit BBG3 to be one and also providing the number of the gating circuits to be one.

Fourth Embodiment

Figure 15:
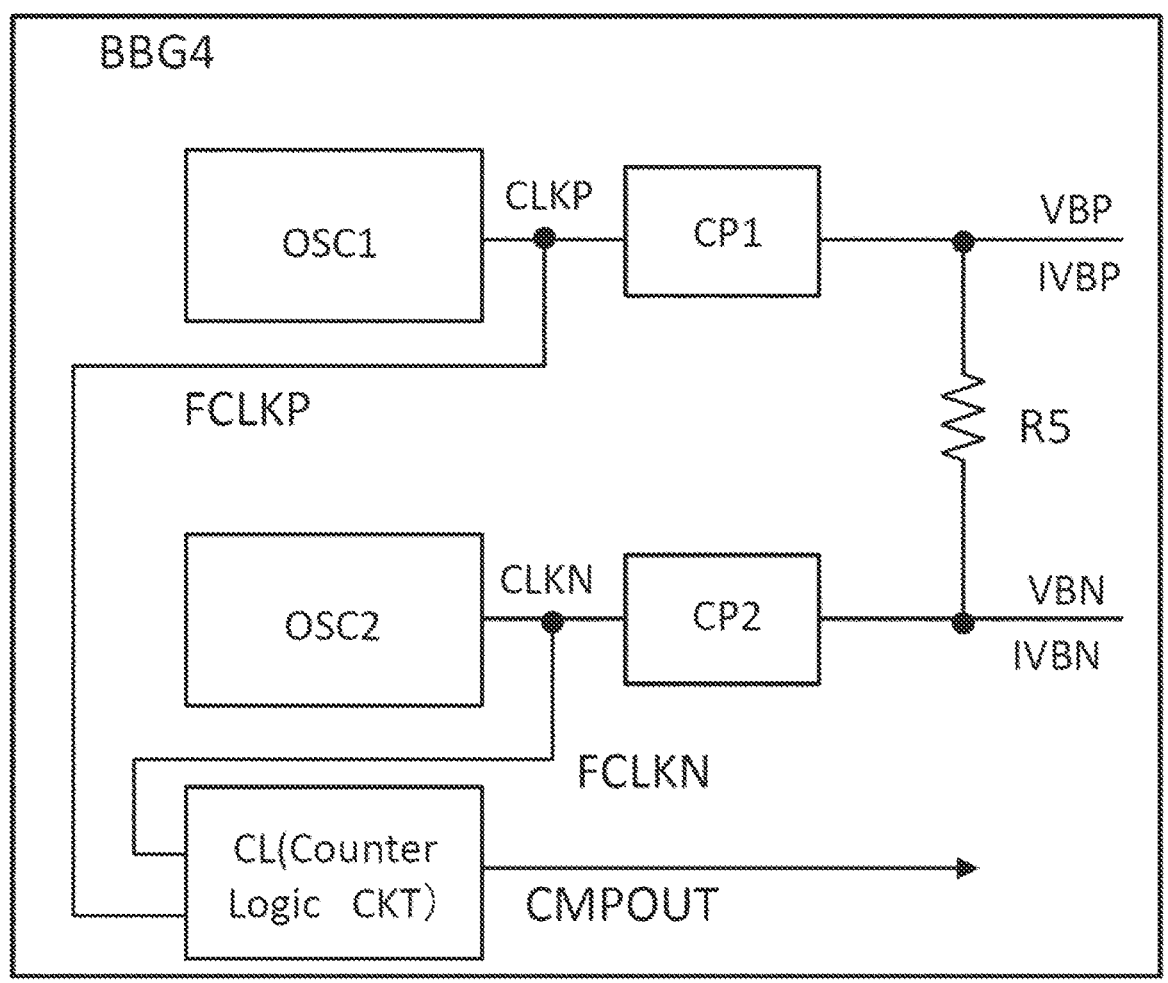
FIG. 15 is a diagram showing a configuration example of a substrate bias generating circuit according to a fourth embodiment.

FIG. 15 is a diagram showing a configuration example of a substrate bias generating circuit BBG4 according to a fourth embodiment.

In a configuration example of the substrate bias generating circuit BBG4 of the fourth embodiment, a resistive element R5 is arranged between the first substrate bias voltage VBP and the second substrate bias voltage VBN of the first to third embodiments. In other words, the resistive element R5 is arranged between the output of the first charge pump CP1 (or a first output signal line connected to the output terminal of the first charge pump CP1) and the output of the second charge pump CP2 (or a second output signal line connected to the output terminal of the second charge pump CP2).

Under environment such as a low temperature state in which the leakage is extremely small, the leakage current in the circuits of the first charge pump CP1 and the second charge pump CP2 that are the voltage boost/drop circuits is dominative, and the relation of "IVBP/IVBN A>1" is possibly not satisfied. In order to suppress this occurrence, the resistive element R5 is arranged between the first substrate bias voltage VBP and the second substrate bias voltage VBN, and therefore, the minimum current of "IVBP/IVBN" can be provided. In this case, the IVBP is a current flowing from the output of the first charge pump CP1 toward the substrate gate of the P-channel MISFET 2. The IVBN is a current flowing from the output of the second charge pump CP2 toward the substrate gate of the N-channel MISFET 3.

Fifth Embodiment

Figure 16:
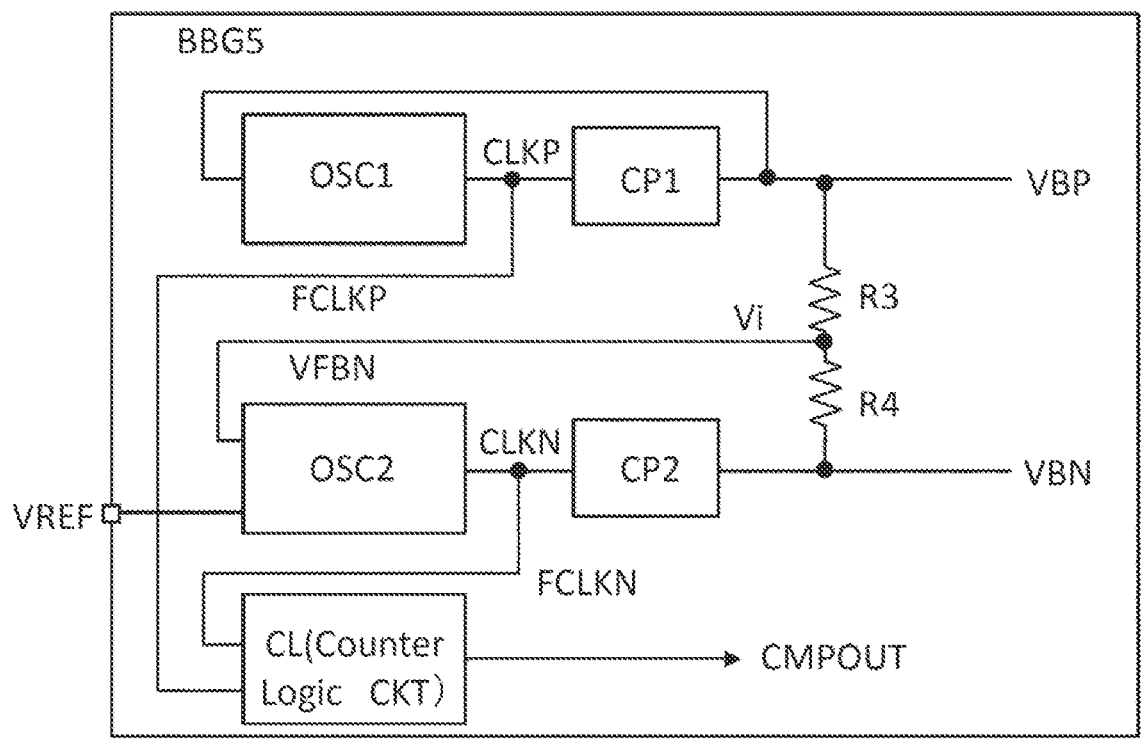
FIG. 16 is a diagram showing a configuration example of a substrate bias generating circuit according to a fifth embodiment.
Figure 17:
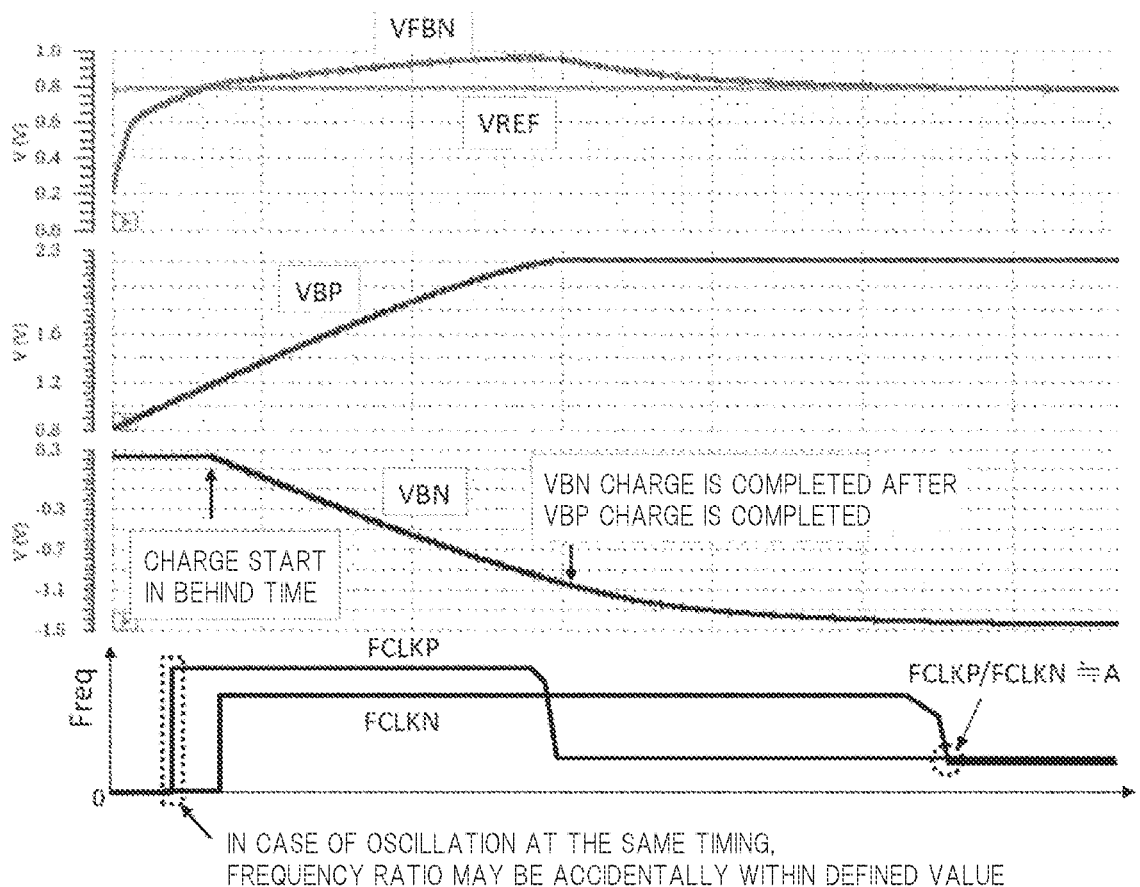
FIG. 17 is a diagram showing characteristics of the substrate bias generating circuit of FIG. 16.
Figure 18:
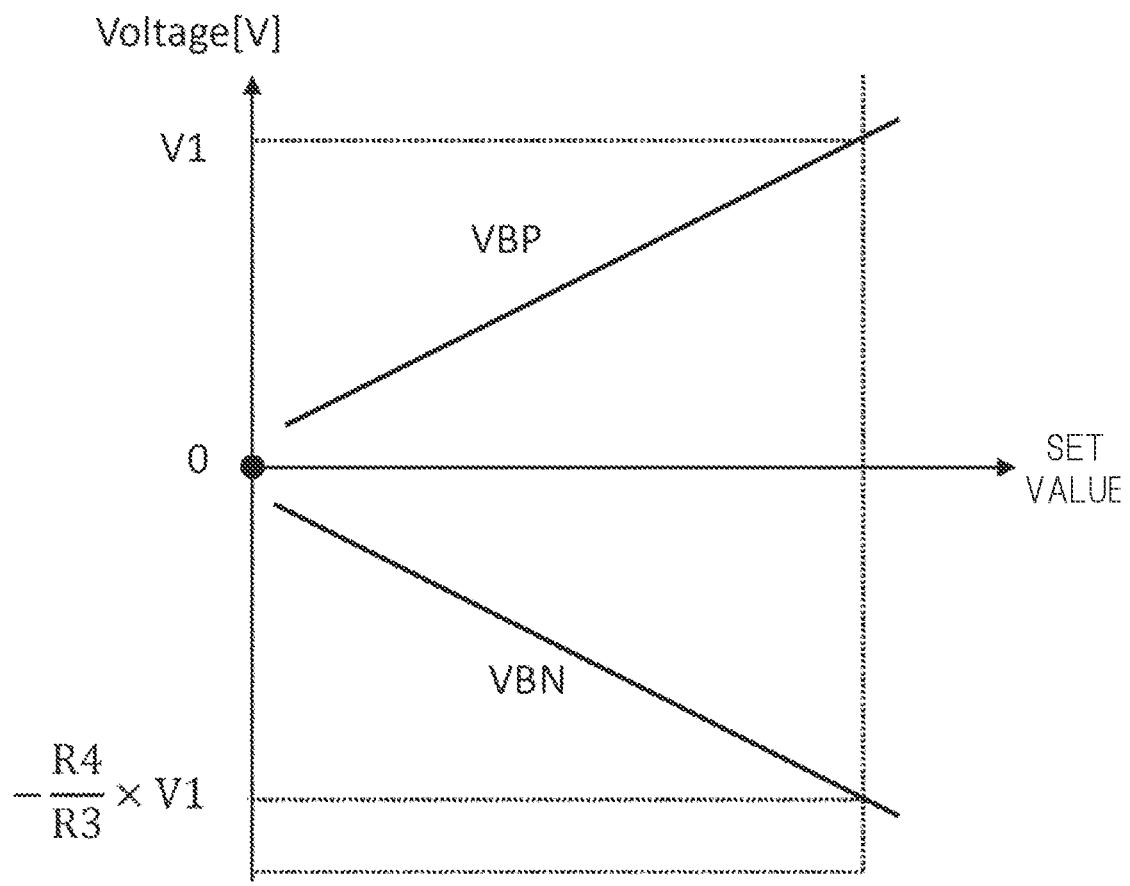
FIG. 18 is a diagram showing dependency of the second substrate bias voltage with respect to a set value of the first substrate bias voltage.
Figure 19:
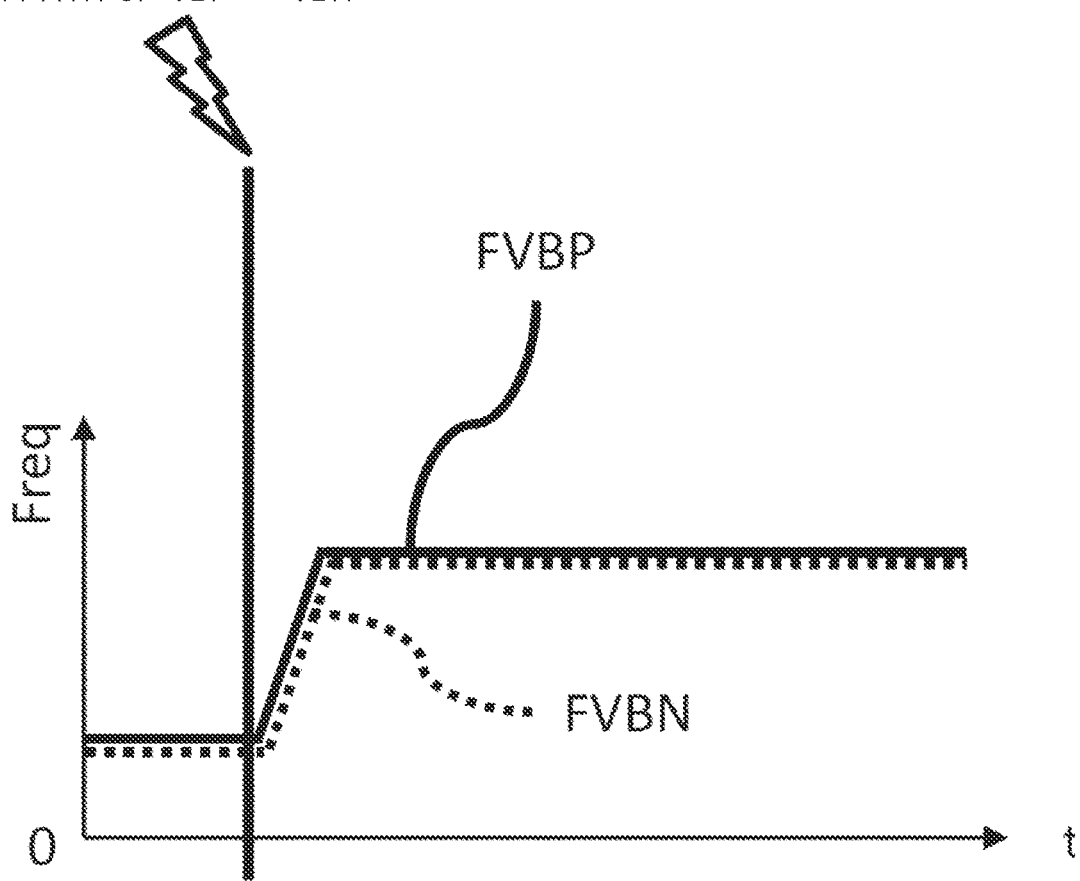
FIG. 19 is a diagram for explaining a case of occurrence of anormal (leakage) current flowing from the first substrate bias voltage to the second substrate bias voltage.
Figure 20:
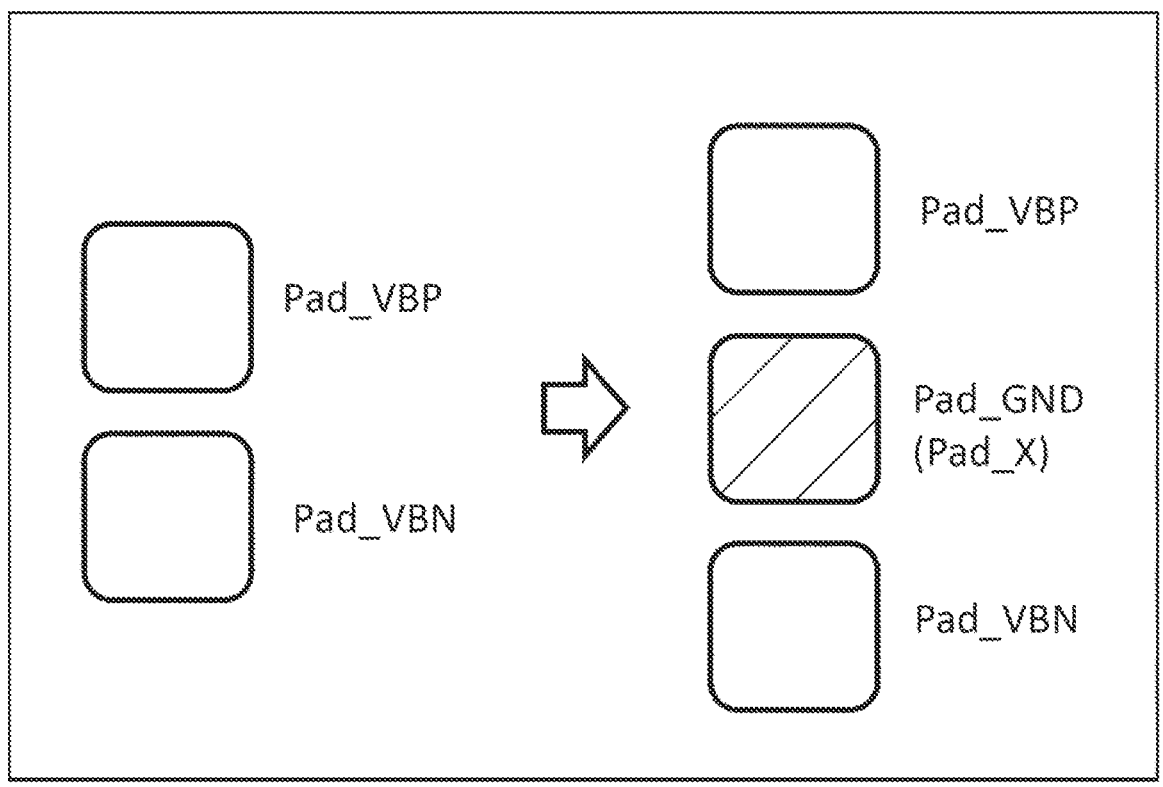
FIG. 20 is a diagram for explaining layout arrangement of a terminal pad of the first substrate bias voltage and a terminal pad of the second substrate bias voltage.

FIG. 16 is a diagram showing a configuration example of a substrate bias generating circuit BBG5 according to a fifth embodiment. FIG. 17 is a diagram showing characteristics of the substrate bias generating circuit BBG5 of FIG. 16. FIG. 18 is a diagram showing dependency of the second substrate bias voltage VBN with respect to the set value of the first substrate bias voltage VBP. FIG. 19 is a diagram for explaining a case of occurrence of anormal (leakage) current flowing from the first substrate bias voltage VBP to the second substrate bias voltage VBN. FIG. 20 is a diagram for explaining layout arrangement of a terminal pad of the first substrate bias voltage VBP and a terminal pad of the second substrate bias voltage VBN.

As shown in FIG. 16, in the substrate bias generating circuit BBG5 according to the fifth embodiment, the resistive element R5 of the fourth embodiment is changed to the resistive element R3 and the resistive element R4. The substrate bias generating circuit BBG5 is configured so that the voltage (VFBN) for the feedback control of the second oscillating circuit OSC2 of the first and fourth embodiments is extracted from a midpoint voltage Vi between the resistive element R3 and the resistive element R4.

Generally, the second substrate bias voltage VBN is the negative voltage, and therefore, the reference voltage VREF and the midpoint voltage Vi (VFBN) generated by the resistive element R3 and the resistive element R4 are compared with each other by the second oscillating circuit OSC2 to provide the set voltage of the second substrate bias voltage VBN.

Because of the configuration of the fifth embodiment, the second substrate bias voltage VBN has characteristics depending on the first substrate bias voltage VBP (see an equation 1).

$$VBN=VBP-((R3+R4)/R3)\times(VBP-VREF) \qquad \text{Equation 1}$$

As shown in FIG. 17, because of the characteristics, the second substrate bias voltage VBN operates to delay the charge start time of the first substrate bias voltage VBP and delay the timing of the charge completion regardless of the performance of the second charge pump CP2 on the voltage drop side. Therefore, the frequency ratio at the time of the shift can be prevented from erroneously being within the defined range.

As shown in FIG. 18, by the change of the set value of the target voltage on the first substrate bias voltage VBP along with the utilization of the characteristics, the second substrate bias voltage VBN can be coordinately changed.

As shown in FIG. 19, if the anomaly (leakage) current flowing from the first substrate bias voltage VBP to the second substrate bias voltage VBN occurs (the leakage in the path "VBP→VBN" occurs) at the time of the anomaly detection, the leakage current equally increases, and the output clocks (FVBP and FVBN) of the first oscillating circuit OSC1 and the second oscillating circuit OSC2 also change by the same rate. Therefore, even in the present invention, the occurrence of the leakage in the path "VBP→VBN" cannot be detected.

Accordingly, in the layout arrangement of the substrate bias generating circuit BBG5, it is effective to remove adjacent arrangement portions. For example, as shown in FIG. 20, in the layout arrangement of a terminal pad Pad_VBP of the first substrate bias voltage VBP and a terminal pad Pad_VBN of the second substrate bias voltage VBN, the terminal pad Pad_VBP and the terminal pad Pad_VBN are not adjacently arranged, and it is effective to arrange a terminal pad Pad_GND of the ground potential GND (VSS) or another terminal pad Pad_X between the terminal pad Pad_VBP and the terminal pad Pad_VBN.

In the foregoing, the invention made by the present inventors has been concretely described on the basis of the embodiments. However, it is needless to say that the present invention is not limited to the foregoing embodiments and working examples, and various modifications can be made.

What is claimed is:

1. A semiconductor device comprising:
   a voltage boost circuit outputting a boost voltage based on a first clock signal having a first frequency;
   a voltage drop circuit outputting a drop voltage based on a second clock signal having a second frequency;
   a logic circuit block comparing the first frequency and the second frequency and outputting a comparison result between the first frequency and the second frequency in accordance with predetermined criteria;
   a first oscillating circuit outputting the first clock signal having the first frequency; and
   a second oscillating circuit outputting the second clock signal having the second frequency.

2. A semiconductor device comprising:
   a voltage boost circuit outputting a boost voltage based on a first clock signal having a first frequency;
   a voltage drop circuit outputting a drop voltage based on a second clock signal having a second frequency;
   a logic circuit block comparing the first frequency and the second frequency and outputting a comparison result between the first frequency and the second frequency in accordance with predetermined criteria;
   a first oscillating circuit outputting the first clock signal having the first frequency; and
   a first gating circuit gating the first clock signal having the first frequency and outputting the second clock signal having the second frequency.

3. A semiconductor device comprising:
   a voltage boost circuit outputting a boost voltage based on a first clock signal having a first frequency;
   a voltage drop circuit outputting a drop voltage based on a second clock signal having a second frequency;
   a logic circuit block comparing the first frequency and the second frequency and outputting a comparison result between the first frequency and the second frequency in accordance with predetermined criteria;
   a first oscillating circuit;
   a first gating circuit gating an output of the first oscillating circuit and outputting the first clock signal having the first frequency; and
   a second gating circuit gating the output of the first oscillating circuit and outputting the second clock signal having the second frequency.

4. The semiconductor device according to claim 1, further comprising:
   a resistive element arranged between an output of the voltage boost circuit and an output of the voltage drop circuit.

5. The semiconductor device according to claim 4,
   wherein the resistive element includes:
   a first resistive element and a second resistive element, and
   wherein the second oscillating circuit generates the second frequency of the second clock signal, based on comparison between a reference voltage and a midpoint voltage at a connection point between the first resistive element and the second resistive element.

\* \* \* \* \*